(12) United States Patent
Lin et al.

(10) Patent No.: US 7,045,812 B2
(45) Date of Patent: May 16, 2006

(54) TECHNOLOGY FOR INCREASING BANDWIDTH OF SEMICONDUCTOR OPTICAL AMPLIFIERS/SUPERLUMINESCENT DIODES USING NON-IDENTICAL MULTIPLE QUANTUM WELLS

(75) Inventors: Ching Fuh Lin, Taipei (TW); Bing Ruey Wu, Taipei (TW)

(73) Assignee: National Science Council, Taipei (TW)

( * ) Notice: Subject to any disclaimer, the term of this patent is extended or adjusted under 35 U.S.C. 154(b) by 0 days.

(21) Appl. No.: 09/974,420

(22) Filed: Oct. 9, 2001

(65) Prior Publication Data
US 2003/0205706 A1 Nov. 6, 2003

(30) Foreign Application Priority Data
Apr. 19, 2001 (TW) ............... 90109399 A

(51) Int. Cl.
*H01L 33/00* (2006.01)
(52) U.S. Cl. ............... 257/17; 438/47; 372/45.011
(58) Field of Classification Search ................. 257/17; 372/45.011; 438/47
See application file for complete search history.

(56) References Cited

U.S. PATENT DOCUMENTS
6,014,250 A * 1/2000 Granestrand ............... 359/344

6,288,410 B1 * 9/2001 Miyazawa ................... 257/14
6,400,742 B1 * 6/2002 Hatakoshi et al. ............ 372/46

OTHER PUBLICATIONS

Ng, "Complete Guide to Semiconductor Devices," 1995, McGraw-Hill, pp. 390-391.*
Lin et al., "Electron-Determined Nonuniform Carrier Distribution among InGaAsP Multiple Quantum Wells", Jpn. J. Appl. Phys., vol. 42 (2003) pp. 5557-5558.
Lin et al., "Sequence influence of nonidentical InGaAsP quantum wells on broadband characteristics of semiconductor optical amplifiers-superluminescent diodes", Optical Society of America, vol. 26, No., 14, Jul. 15, 2001, pp. 1099-1100.

* cited by examiner

*Primary Examiner*—Jerome Jackson
(74) *Attorney, Agent, or Firm*—Merchant & Gould P.C.

(57) ABSTRACT

The present invention provides a technology for increasing the spectral width of semiconductor optical amplifiers, employing different separate confinement heterostructures (SCH's) so as to form non-identical multiple quantum wells such that the semiconductor photo-electronic devices have better temperature characteristics and more reliable modulation characteristics. If such a technology is used in the fabrication of semiconductor laser with a tunable wavelength, it is possible to achieve a large range of modulated wavelength, which is very useful in optical communication.

7 Claims, 8 Drawing Sheets

| |
|---|
| P-InP |
| InGaAsP quaternary @ 1.1μm        750Å |
| $In_{0.86}Ga_{0.14}As_{0.3}P_{0.7}$        450Å |
| $In_{0.67}Ga_{0.33}As_{0.72}P_{0.28}$        60Å |
| $In_{0.86}Ga_{0.14}As_{0.3}P_{0.7}$        150Å |
| $In_{0.67}Ga_{0.33}As_{0.72}P_{0.28}$        60Å |
| $In_{0.86}Ga_{0.14}As_{0.3}P_{0.7}$        150Å |
| $In_{0.67}Ga_{0.33}As_{0.72}P_{0.28}$        60Å |
| $In_{0.86}Ga_{0.14}As_{0.3}P_{0.7}$        150Å |
| $In_{0.53}Ga_{0.47}As$        87Å |
| $In_{0.86}Ga_{0.14}As_{0.3}P_{0.7}$        150Å |
| $In_{0.53}Ga_{0.47}As$        87Å |
| $In_{0.86}Ga_{0.14}As_{0.3}P_{0.7}$        450Å |
| InGaAsP quaternary @ 1.1μm        750Å |
| N-InP        0.5μm |
| N+InP  Substrate |

Layer structure for 04291

Fig. 6

TECHNOLOGY FOR INCREASING BANDWIDTH OF SEMICONDUCTOR OPTICAL AMPLIFIERS/SUPERLUMINESCENT DIODES USING NON-IDENTICAL MULTIPLE QUANTUM WELLS

CROSS-REFERENCE TO RELATED APPLICATIONS

Not Applicable

STATEMENT REGARDING FEDERALLY SPONSORED RESEARCH OR DEVELOPMENT

Not Applicable

REFERENCE TO A "SEQUENCE LISTING"

Not Applicable

BACKGROUND OF THE INVENTION

1. Field of the Invention

The present invention generally relates to a technology concerning the bandwidth of semiconductor opto-electronic devices, and more particularly, to a technology employing different separate confinement heterostructures (SCH's) of different lengths and/or non-identical multiple quantum wells such that the semiconductor photo-electronic devices have broad bandwidth, better temperature characteristics and more reliable modulation characteristics.

2. Description of the Related Art

With the arrival of the network era, indispensable components for use in fiber-based networks, such as transmission terminals, receiving terminals, switching terminals, etc., have attracted tremendous attention in both research and commercial applications. Semiconductor devices have become the major players in fiber communication due to their small sizes, high efficiency and high frequency handling ability, and high reliability (in both temperature and lifetime). The functions for relaying optical signal amplification and optical switching of semiconductor optical amplifiers (SOA's)/superluminescent diodes (SLD's) have been widely used. However, the conventional semiconductor optical amplifiers only provide a spectral width of about 40 nm, which is insufficient for wide-band fiber communication.

On the other hand, even though Er-doped fiber amplifiers (EDFA's) are widely used as relaying optical signal amplifiers in optical communication, they cannot be employed in another important band around 1300 nm due to the limitation of the available spectral width between C-band and L-band, i.e., 1525 nm~1605 nm. This makes the application of the Er-doped fiber amplifier unable to cover the whole range between 1200 nm~1600 nm of fiber communication. Therefore, there is need in providing a new relaying optical signal amplifier that has a wider band.

The device characteristics such as the threshold current density, the temperature dependence and the spectral width for the gain of a semiconductor quantum well laser are better than those of a bulk semiconductor laser. The thin epitaxial layers that form the quantum well structure, be it for research or commercial application, can be grown by metal-organic chemical vapor deposition (MOCVD) or molecular beam epitaxy (MBE). By using the conventional semiconductor fabrication process, semiconductor lasers can be formed of such a quantum well structure.

According to the recently published reports, however, the carriers generated by current injection do not distribute uniformly in the multiple quantum wells. If we want to increase the spectral width for the gain, uniformity of carrier distribution must be taken into account. In the prior art, several efforts have been made to increase the spectral width for the gain by using asymmetric multiple quantum well implementation without considering the uniformity of carrier distribution. However, the results are far from satisfactory.

Therefore, the inventors of the present invention proposed a technology employing multiple quantum wells of different widths so as to utilize the energy levels and the non-uniformity of carrier distribution in the multiple quantum wells to obtain a very large spectral width for the gain. In such a manner, the semiconductor optical amplifier of the present invention can cover the broad spectral width of 1300 nm~1600 nm. In addition, by using separate confinement heterostructures of a certain wavelength, the dominant carriers controlling the two-dimensional carrier distribution could be either electrons or holes, leading to a wider spectral width for the gain as well as better temperature characteristic.

BRIEF SUMMARY OF THE INVENTION

It is the primary object of the present invention to provide a technology employing multiple quantum wells of different widths so as to increase the spectral width of a semiconductor optical device, in which the dominant carriers controlling the two-dimensional carrier distribution are either electrons or holes, leading to a wider spectral width as well as better temperature characteristic.

In order to achieve the foregoing objects, the present invention provides a new technology for increasing the spectral width of semiconductor optical amplifiers, characterized in that: whether the two-dimensional carrier distribution in multiple quantum wells of different widths is controlled by electrons or holes depends on the separate confinement heterostructures (SCH's); by using said technology, semiconductor optical amplifiers/superluminescent diodes/lasers are formed to have a large spectral width, better temperature and modulation characteristics, and large wavelength range so as to be used in optical communication systems and reduce the fabrication cost.

BRIEF DESCRIPTION OF THE SEVERAL VIEWS OF THE DRAWINGS

The objects, spirits and advantages of the preferred embodiments of the present invention will be readily understood by the accompanying drawings and detailed descriptions, wherein:

FIG. 6 is a schematic diagram showing an epitaxial structure for a laser diode, labeled 04291;

DETAILED DESCRIPTION OF THE INVENTION

The objects, spirits and advantages of the present invention are described in detail with reference to a preferred embodiment accompanied by the drawings.

Figure 1:
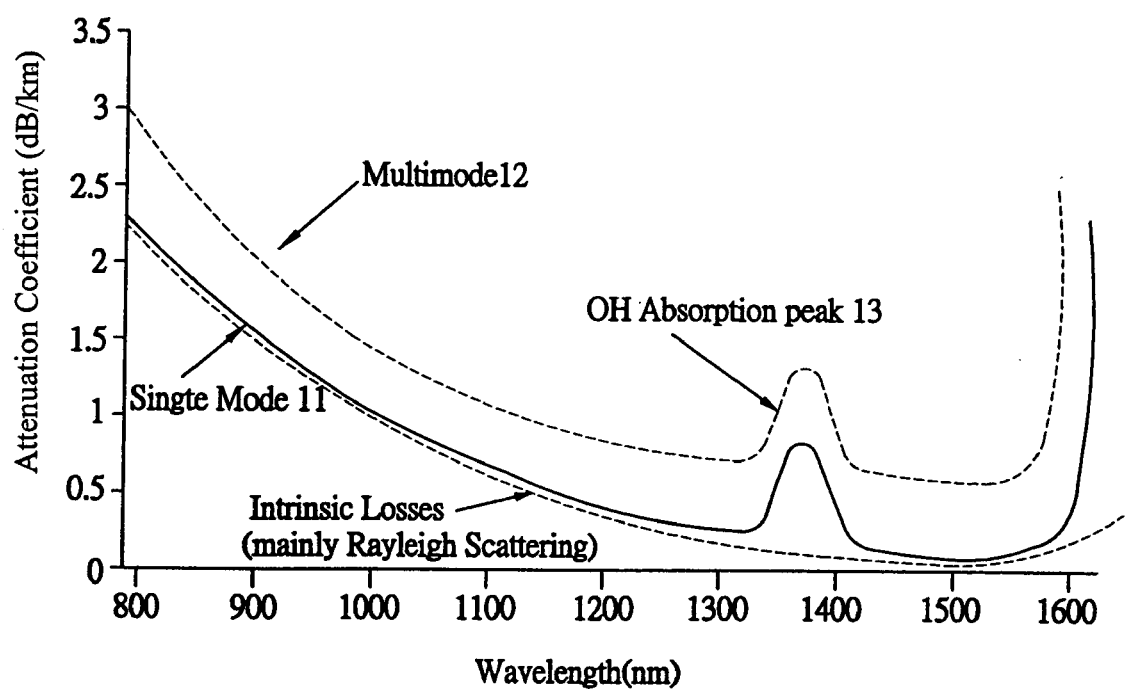
FIG. 1 is an absorption spectrum of a presently used fiber.

Please refer to FIG. 1, which is an absorption spectrum of a presently used fiber. As shown in the drawing, the lower solid line is for the single-mode fiber 11 that is doped with 4% of $GeO_2$ in the fiber core and the upper dotted line is for the multi-mode fiber 12. In addition, the absorption peak 13 at around 1400 nm is due to the $H_2O$ molecules in the fiber. The resonating wavelength of the OH bond is 1385 nm. This absorption peak could also be removed by new technologies so as to provide the entire low loss band of optical fibers, covering from less than 1300 nm to over 1600 nm.

Due to the rapid development in fiber fabrication, the wavelength range for optical communication becomes broader and broader. Not only at 1300 nm, instead, it covers the wavelength range from 1300 nm to 1600 nm. Even though the Er-doped fiber amplifier has a high coupling efficiency with the fiber, it suffers from limited spectral width for gain. In addition, the Er-doped fiber amplifier can not even be used at around 1300 nm. Therefore, in the wavelength range beyond C-band and L-band, various ion-doped fiber amplifiers of different spectral widths are required. Thus the fabrication cost is increased, which is one of the major drawbacks of the wavelength-division multiplexing (WDM) system.

When the semiconductor optical amplifier is used as a relay in the fiber communication system, it is preferable that it provides a uniform gain spectrum in the wavelength range of 1300 nm to 1600 nm. However, the conventional semiconductor optical amplifier only provides a spectral width of 40 nm, which is not sufficient for the wide-band fiber communication.

From the related research reports, it is found that, for the widely used devices in optical communication, the carrier distribution in multiple quantum wells is not uniform, depending on the quantum well structure including the materials and the arrangement of epitaxial layers. This makes the design of the quantum well structure more complicated. Therefore, the past concepts of using quantum wells of different widths or different material combinations are not good enough to achieve broadband purpose.

Figure 2:
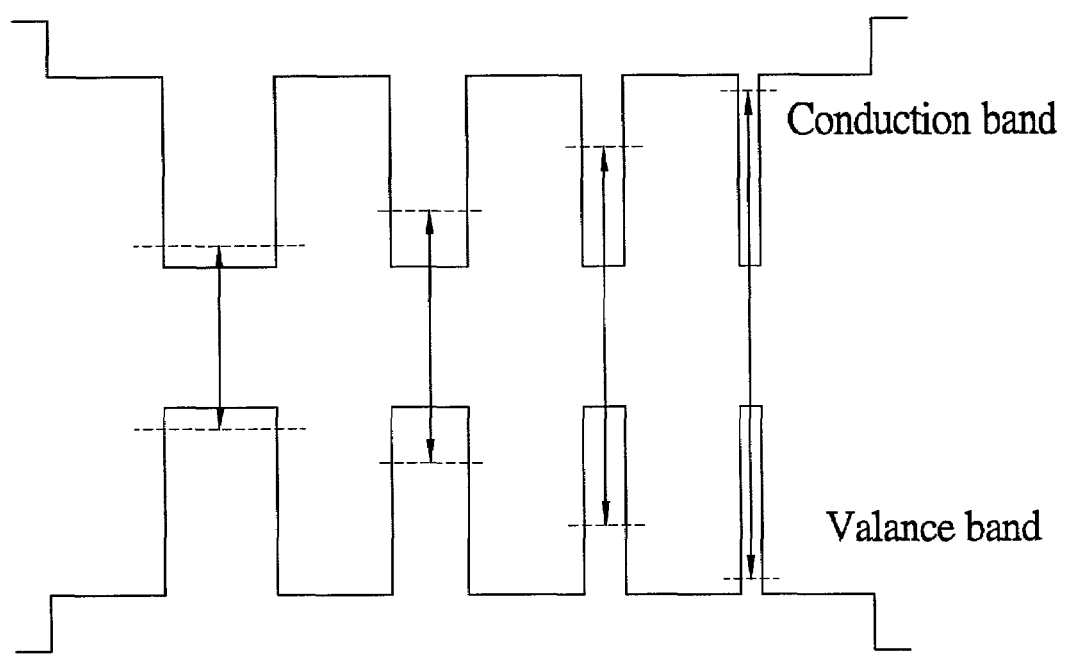
FIG. 2 is a graph showing the quantized energy levels where the used materials for the barriers and the wells are repeatedly alternating.

To design multiple quantum wells with different widths and/or different material combinations for a larger spectral width, several considerations must be taken into account:

1. Energy levels in quantum wells with different widths. The desired wavelength can be completed by stacking quantum wells with different widths so as to achieve a wide-band structure. However, several considerations must be taken into account:

a. If the used materials for the barriers and the wells are repeatedly alternating (as shown in FIG. 2), it is found that, from the calculation based on quantum mechanics, a lower quantized energy level with a longer wavelength occurs in a wider quantum well; however, a higher quantized energy level with a shorter wavelength occurs in a narrower quantum well. After the calculation for the gain spectrum, it is found that a wider quantum well requires a lower carrier concentration to achieve the same gain. This will influence the final gain distribution.

Figure 3:
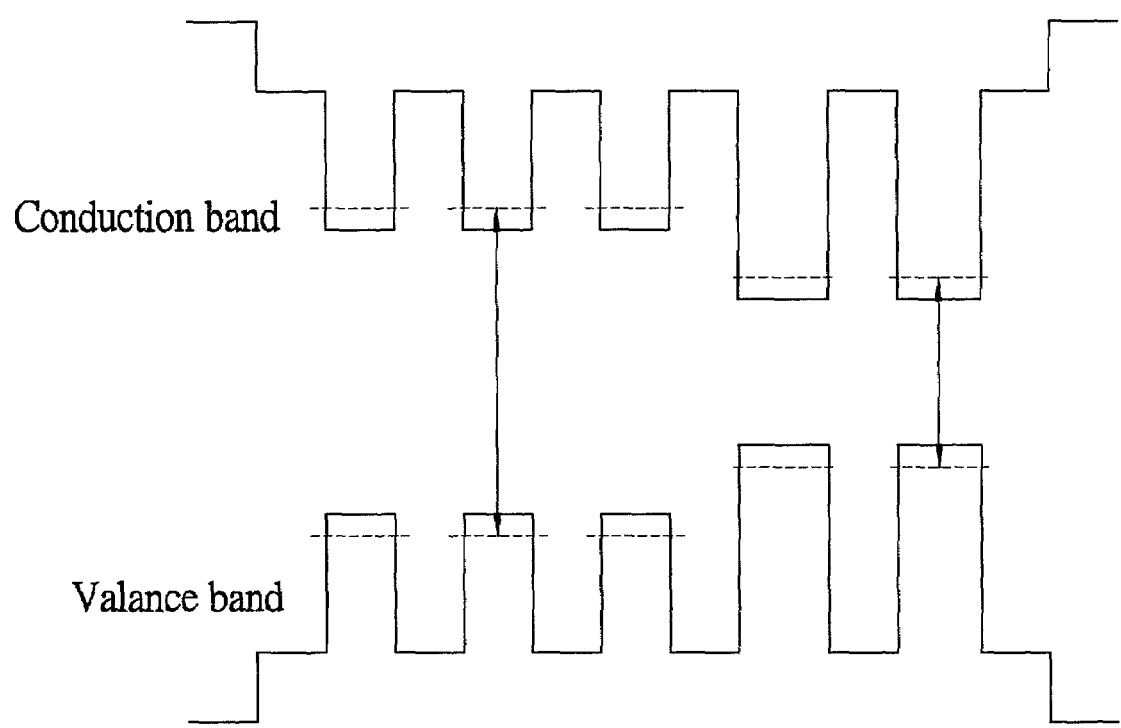
FIG. 3 is a graph showing the quantized energy levels where the multiple quantum wells are formed of different materials and of different well widths.

When the number of the quantum wells for the longer wavelength is N, then the number of the quantum wells for the shorter wavelength is (N+1) if the difference in light-emitting energy between the quantum wells for the longer wavelength and the quantum wells for the shorter wavelength is less than 200 meV.

b. If the used materials for both the barriers and the wells do not remain unchanged, the degree of freedom in design increases. Various materials can be used to form the multiple quantum wells with different widths so as to obtain nearly equal quantized energy levels with different light-emitting wavelength. Please refer to FIG. 3, which is a band diagram showing multiple quantum wells formed of different materials and of different well widths. It is found that the spectral width is increased and the gain is equal for certain range of pumping levels.

c. Since the light emitted from the quantum wells with higher energy levels will be absorbed by the quantum wells with lower energy levels, the number of the quantum wells with higher energy levels is larger when multiple quantum wells with different widths are designed.

2. The lengths of separate confinement heterostructures: In the semiconductor quantum well structure, the holes and electrons generated by current injection are injected into the p-type and the n-type contact, respectively, via the separate confinement heterostructures and then recombine to emit light in the active region. Therefore, the carrier velocity in the separate confinement heterostructures is an important factor for the control of the two-dimensional carrier distribution.

a. If the electrons enter the quantum wells earlier than the holes, the electrons become the dominant carriers that control the two-dimensional carrier distribution. The final two-dimensional carrier distribution depends on the spatial distribution of the electrons (wherein the electron concentration near the n-type contact is higher since the electrons enter the quantum wells near the n-type contact) and charge neutrality causes holes to follow electron distribution. Similarly, if the holes enter the quantum wells earlier than the electrons, the holes become the dominant carriers that control the two-dimensional carrier distribution. We can determine which type of carriers to be dominant carriers by the following model:

$$\tau_{LF} = \tau_{p,diffusion} + \tau_{n,diffusion} + \tau_{cap,p} + \tau_{cap,n} = d_p^2/4D_p + d_n^2/4D_n + d_p\tau_{cp}/W + d_n\tau_{cn}/W \tag{1}$$

where $d_p$ ($d_n$) represents the diffusion length of the holes (electrons) to the quantum wells (i.e., the lengths of the SCH regions), $D_p$ and $D_n$ are the diffusion coefficients of the materials, W is the width of the quantum well, and $d_p\tau_{cp}$ and $d_n\tau_{cn}$ are the capture times obtained according to quantum mechanics. Therefore, the four terms on the right-hand side of the equation are the diffusion time of the hole in the SCH region, the diffusion time of the electron in the SCH region, the equivalent capture time of the holes by the quantum well, and the equivalent capture time of the electrons by the quantum well. It should be noted that due to the accumulation of the carriers in the SCH region before captured by the quantum well, the equivalent capture time of the carriers in the quantum well is described as: the capture time (calculated by using quantum mechanics) times a volume ratio $d_p(d_n)/W$.

b. The total time of the hole (the diffusion time of the hole plus the equivalent capture time of the hole) is defined as the time period between the time the hole is injected into the SCH region and the time the hole is captured by the two-dimensional energy level, i.e., $\tau_{p,total} = \tau_{p,diffusion} + \tau_{cap,p}$; while the total time of the electron (the diffusion time of the electron plus the equivalent capture time of the electron) is defined as the time period between the time the electron is injected into the SCH region and the time the electron is captured by the two-dimensional energy level, i.e., $\tau_{n,total} = \tau_{n,diffusion} + \tau_{nap,n}$. If $\tau_{p,total} > \tau_{n,total}$, the electrons enter the two-dimensional energy level in the quantum well earlier than the holes, resulting in a higher electron concentration on the n-side. The holes that enter the two-dimensional energy level in the quantum well later distribute accordingly. Therefore, a higher two-dimensional carrier concentration appears on the n-side. On the contrary, if $\tau_{n,total} > \tau_{p,total}$, the holes enter the two-dimensional energy level in the quantum well earlier than the electrons, resulting in a higher hole concentration on the p-side. The electrons that enter the two-dimensional energy level in the quantum well later distribute accordingly. Therefore, a higher two-dimensional carrier concentration appears on the p-side. If the holes are the dominant carriers, better temperature characteristics can be obtained since the holes have lower sensitivity to the temperature due to the heavier effective mass; on the contrary, if the electrons are the dominant carriers, a larger spectral width can be obtained due to the more uniform carrier distribution in the quantum well. Both situations have to be considered for different applications.

c. The uniformity of the carrier distribution in the quantum well: The carrier capture rate of the quantum well, i.e., the carrier capturing ability of the quantum well, is dependent on the two-dimensional density of states in the quantum well. The higher the two-dimensional density of states in the quantum well is, the stronger the carrier capturing ability is. Together with the dominant carrier as mentioned above, the carrier capture rate influences the uniformity of the carrier distribution in multiple quantum wells of different widths. In order to obtain a larger spectral width, the carriers must be uniformly distributed in the designed multiple quantum wells of different widths. However, some optical characteristics of the device, such as light-emitting efficiency, will be sacrificed.

d. Some of the following factors also have influences on the uniformity of the carrier distribution in the quantum well:

(i) The materials for the wells and the barriers as well as the arrangement and the widths of multiple quantum wells. According to our experimental analysis, the materials will strongly influence the carrier confinement of the quantum well and furthermore the two-dimensional carrier distribution. The width of the quantum well influences the two-dimensional density of states in the quantum well and furthermore the uniformity of the carrier distribution.

Figure 4:
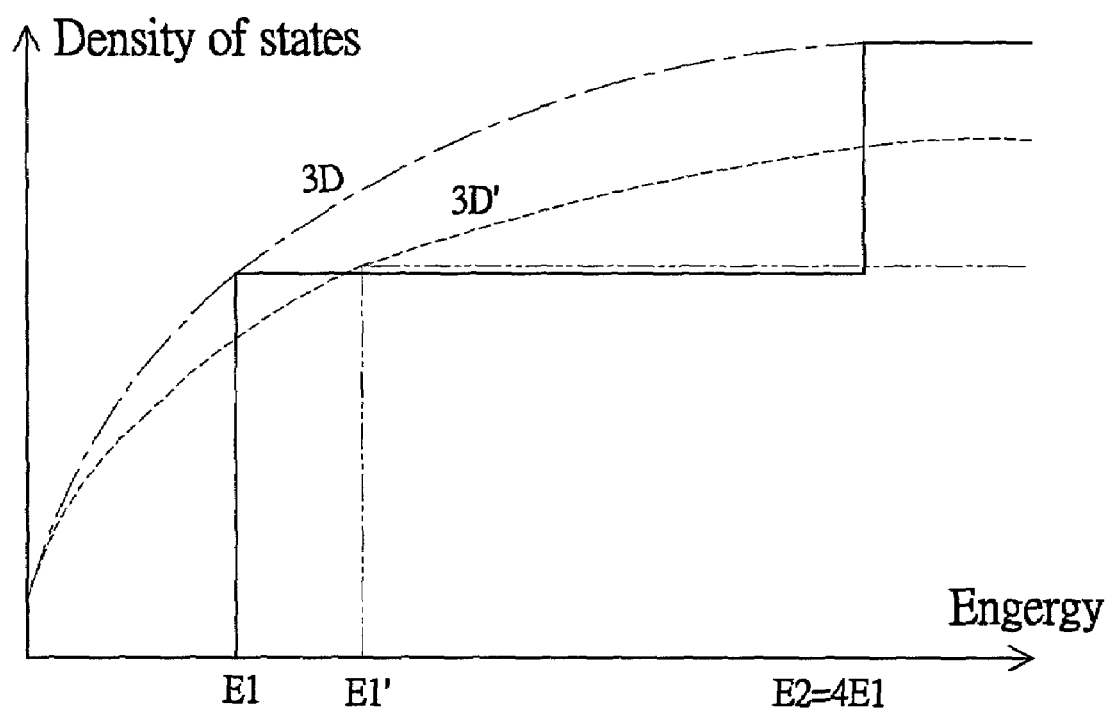
FIG. 4 is a graph showing the relation between the energy and the density of states.

Please refer to FIG. 4, which is a graph showing the relation between the energy and the density of states. As shown in the figure, each curve represents a material, i.e., a three-dimensional density of states. The energy level of a quantum well can be expressed as a step function. However, it is notable that the two-dimensional density of states and the three dimensional density of states almost overlap. In the figure, 3D and 3D' represent different materials and E1 and E1' are the first energy levels in the quantum wells of different widths. If the quantized energy levels of the designed quantum wells do not differ a lot, the major difference between the two-dimensional densities of states results from the composition of bulk materials. In addition, the density of states influences the carrier capturing ability of the quantum wells as well as the uniformity of the two-dimensional carrier distribution. Therefore, the two-dimensional density of states is related to the width of the quantum well and the material composition, and should be taken into account.

(ii) The width and the height of the barrier: According to our experimental analysis, in the designed structure having multiple quantum wells, the larger the barrier width is, the more uniformly the carriers distribute in the multiple quantum wells. On the contrary, as the barrier height of the multiple quantum wells decreases, the two-dimensional carrier distribution becomes more uniform.

Figure 5:
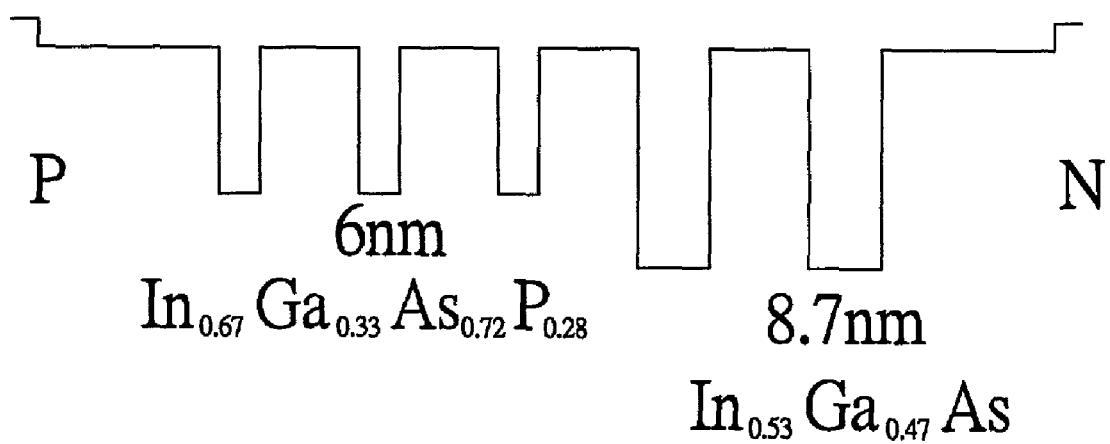
FIG. 5 is a band diagram showing an epitaxial structure for a laser diode, labeled 04291.
Figure 7:
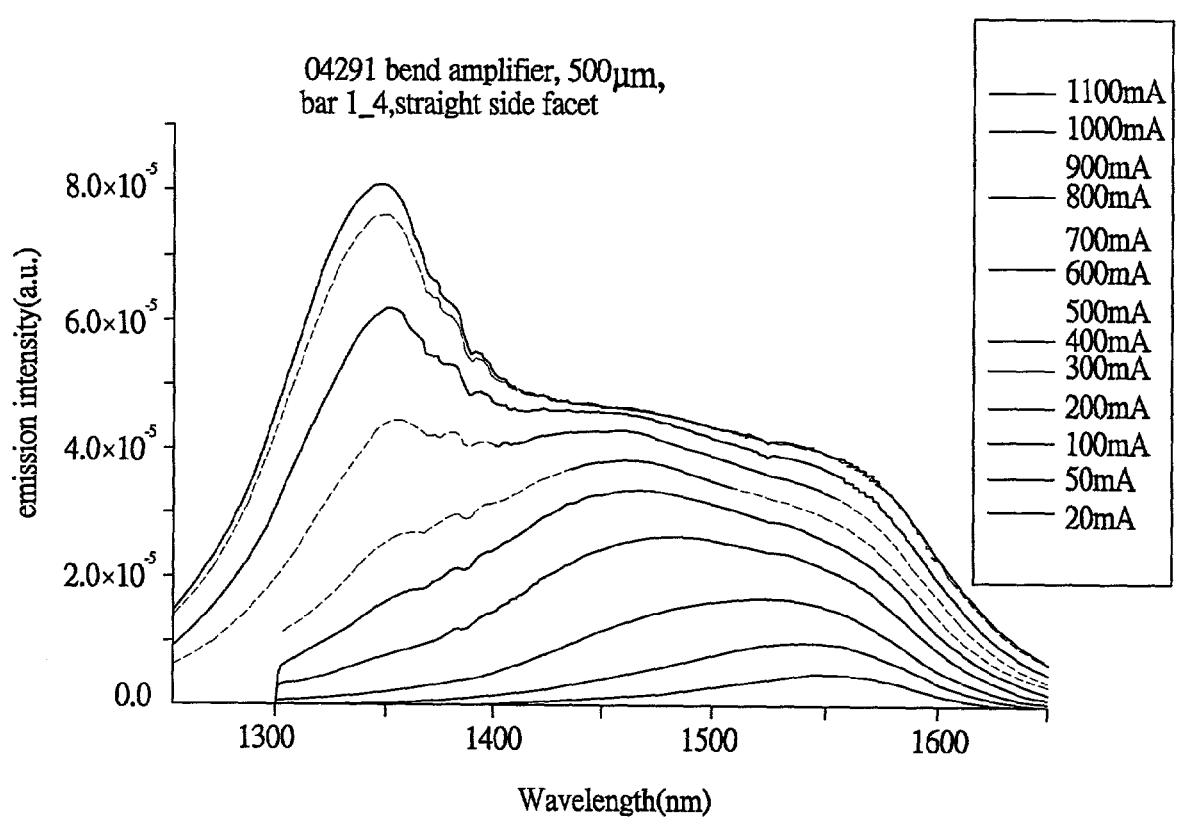
FIG. 7 is a graph showing the emission spectrum of a laser diode 04291 under different driving current densities.
Figure 8:
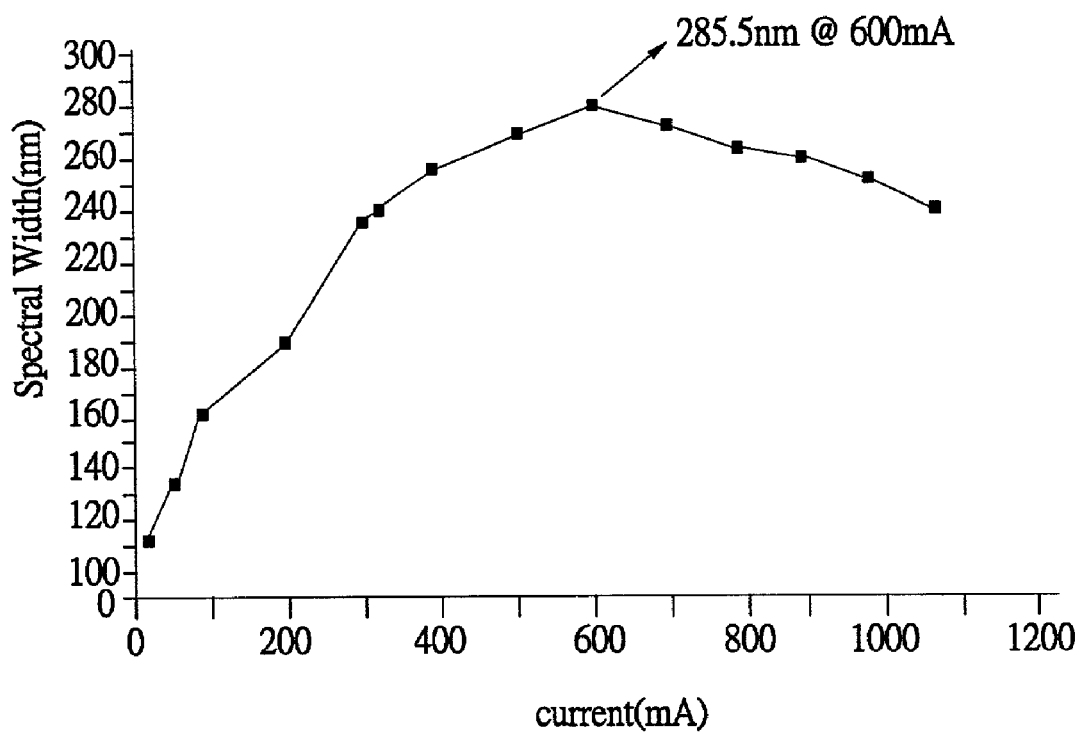
FIG. 8 is a graph showing the relation between the spectral width and the driving current.

3. Accordingly, an epitaxial structure for a laser diode is labeled 04291 as shown in FIGS. 5 and 6. The structure comprises different materials to compose multiple quantum wells of different widths. The materials for the quantum wells are $In_{0.67}Ga_{0.33}As_{0.72}P_{0.28}$ and $In_{0.53}Ga_{0.47}As$. The material for the barriers is $In_{0.86}Ga_{0.14}As_{0.3}P_{0.7}$. The expected wavelengths for light-emitting are 1.3 μm and 1.55 μm. Under different driving current densities, the spectrum shows that the laser diode emits light at 1.3 μm and 1.55 μm, as shown in FIG. 7. The range covers the region between 1.3 μm and 1.55 μm, leading to a spectral width of 285.5 nm, as shown in FIG. 8. This is the widest range to date. In the designed SCH region, the dominant carriers are electrons close to the $In_{0.53}Ga_{0.47}As$ on the n-side. Since the dominant carriers are electrons close to the $In_{0.53}Ga_{0.47}As$ on the n-side, the carrier capturing ability is poorer than that in the $In_{0.67}Ga_{0.33}As_{0.72}P_{0.28}$ quantum wells. Therefore, it is obvious that the carrier distribution in the multiple quantum well structure is uniform. With uniform carrier distribution, the multiple quantized energy levels in those QWs can mostly contribute to the emission and gain, so broadband characteristics can be achieved.

However, in the multiple quantum wells of different widths where the dominant carriers are holes, the diffusion time of the hole in SCH structure must be shorter than the equivalent capture time of the electrons by the quantum well. From equation (1), it is found that it is related to the material composition and the length of the SCH. By adjusting the material composition and the length of the SCH, multiple quantum wells of different widths where the advantage carriers that dominate the two-dimensional carrier distribution are holes can be obtained.

If we still employ the structure labeled 04291 in FIG. 5 with a changed SCH length, the length must be shorter than 65 nm when the length of the SCH near the n-side remains unchanged while the length of the SCH near the p-side is changed. However, if the lengths of the SCH structures on both sides are changed, the lengths must be shorter than 40 nm. The lengths of the SCH structures are determined by the carrier distribution dominated by the holes. Such a design provides better temperature characteristics and modulated spectral width, but may suffer from poorer uniformity of carrier distribution.

As mentioned above, the present invention related to a technology concerning the spectral width of semiconductor photo-electronic devices, employing different separate confinement heterostructures (SCH's) so as to form non-identical multiple quantum wells such that the semiconductor optoelectronic devices have better temperature characteristics and better modulation characteristics. Therefore, the present invention has been proved to be progressive and have great potential in both research and commercial applications.

The invention claimed is:

1. A method for producing an opto-electrical device having a spectral bandwidth, the method comprising:
   stacking a plurality of quantum wells, each having a two-dimensional density of states, on an epitaxial layer, forming at least two of the quantum wells with different widths and barrier heights;
   arranging a plurality of separate confinement heterostructures amongst the quantum wells, each of the separate confinement heterostructures having a thickness of at least 120 nm;
   injecting electrons into a first end of a region containing the quantum wells and separate confinement heterostructures;
   injecting holes into a second, opposite end of the region; and
   distributing the electrons and holes uniformly within the quantum wells by enabling the electrons to enter the quantum wells before the holes, including
   selecting the composition of the quantum wells and the separate confinement heterostructures based on capture time of the electrons and the holes in the quantum wells;
   selecting the thickness of the separate confinement heterostructures based on the two-dimensional density of states within the quantum wells, comprising selecting a greater thickness to obtain greater uniformity in the electron and hole distribution; and
   selecting a barrier height of the separate confinement heterostructures based on the two-dimensional density of states within the quantum wells, comprising selecting a lesser height to obtain greater uniformity in the electron and hole distribution.

2. The method of claim 1 further including forming at least one of the plurality of quantum wells from a different material than the other quantum wells.

3. The method of claim 1 further including forming the opto-electrical device such that the spectral bandwidth is between 120 nm and 400 nm.

4. The method of claim 1 further including forming the opto-electrical device such that the spectral bandwidth is 285 nm.

5. The method of claim 1 further including forming the opto-electrical device to emit light having a wavelength between 1300 nm and 1600 nm.

6. The method of claim 1, wherein forming the at least two quantum wells comprises forming a first one of the two quantum wells with a layer of $In_{0.67}Ga_{0.33}As_{0.72}P_{0.28}$ cladded between two layers of $In_{0.86}Ga_{0.14}As_{0.3}P_{0.7}$, and forming the second one of the two quantum wells with a layer of $In_{0.53}Ga_{0.47}As$ cladded between two layers of $In_{0.86}Ga_{0.14}As_{0.3}P_{0.7}$.

7. The method of claim 6, wherein the first quantum well has a width of about 6 nm.

* * * * *